United States Patent [19]
Bross et al.

[11] Patent Number: 5,305,523
[45] Date of Patent: Apr. 26, 1994

[54] METHOD OF DIRECT TRANSFERRING OF ELECTRICALLY CONDUCTIVE ELEMENTS INTO A SUBSTRATE

[75] Inventors: Arthur Bross, Poughkeepsie; Julian G. Cempa, Deposit; Robert O. Lussow, Hopewell Junction; James A. McDonald, Newburgh; Donald E. Myers, Poughkeepsie; Joseph D. Peruffo, Pleasant Valley; Thomas J. Walsh, Poughkeepsie; Thomas J. Walsh, III, Verbank, all of N.Y.

[73] Assignee: International Business Machines Corporation, Armonk, N.Y.

[21] Appl. No.: 996,445

[22] Filed: Dec. 24, 1992

[51] Int. Cl.⁵ .............................. H05K 3/30
[52] U.S. Cl. ......................... 29/832; 29/739; 29/840; 174/262
[58] Field of Search .............. 29/852, 853, 895, 832, 29/840, 739; 174/262

[56] References Cited

U.S. PATENT DOCUMENTS

| | | |
|---|---|---|
| 1,900,099 | 3/1933 | Ferguson . |
| 2,854,074 | 9/1958 | Frank et al. ............... 164/25 |
| 2,912,745 | 11/1959 | Steigerwalt et al. ........... 29/852 X |
| 2,912,746 | 11/1959 | Oshry et al. ................ 29/852 X |
| 2,912,747 | 11/1959 | Oshry et al. ................ 29/853 X |
| 2,912,748 | 11/1959 | Gray ....................... 29/852 X |
| 2,955,351 | 10/1960 | McCreadie . |
| 3,093,887 | 6/1963 | Prestige et al. . |
| 3,557,446 | 1/1971 | Charschan ................. 29/853 |
| 4,346,516 | 8/1982 | Yokouchi et al. ............ 29/845 |
| 4,897,919 | 2/1990 | Wheeler ................... 89/845 |
| 5,025,553 | 6/1991 | Telco ..................... 29/852 |
| 5,035,049 | 7/1991 | Wheeler ................... 29/845 |

FOREIGN PATENT DOCUMENTS

| | | | |
|---|---|---|---|
| 2734461 | 2/1979 | Fed. Rep. of Germany | 29/845 |
| 983846 | 2/1965 | United Kingdom | 174/262 |
| 1177831 | 1/1967 | United Kingdom . | |

Primary Examiner—Carl J. Arbes
Attorney, Agent, or Firm—Dale M. Crockatt

[57] ABSTRACT

A method is provided for forming one or more electrical conductors in a multilayer structure such as a computer component during a punching operation. A conducting sheet is placed in direct contact with a sheet of a deformable dielectric material. A punch is used to form a conducting slug from the sheet and to simultaneously transfer the slug into the dielectric material. During the transfer operation, a portion of the dielectric material is displaced so as to cause a mechanical interference between the slug and dielectric material.

47 Claims, 7 Drawing Sheets

METHOD OF DIRECT TRANSFERRING OF ELECTRICALLY CONDUCTIVE ELEMENTS INTO A SUBSTRATE

BACKGROUND AND BRIEF SUMMARY OF THE INVENTION

This invention relates to the manufacture of dielectric substrates, particularly multilayer substrates, which include electrically conductive, semi-conductive, resistive, or capacitive elements such as pads, pins, or vias, which substrates may then be used in a computer component.

In the fabrication of high performance computer hardware, it is known practice to attach semiconductor chips to ceramic or plastic chip carriers which contain wiring elements interconnecting individual chips mounted on the same carrier and which contain provisions for electrically connecting the chips to external devices. It is also known practice to fabricate carriers having more than one layer, described variously in the art as multilayer carriers, multilayer modules, multilayer substrates, or multilevel substrates, hereafter referred to as multilayer substrates. Such multilayer substrates consist of one or more layers or sheets of a dielectric material which form insulating levels together with alternating layers consisting of individual co-planar, or essentially co-planar, conducting elements which form circuit pattern levels. A preferred feature of a multilayer substrate is a means for interconnecting the individual co-planar conducting elements from one side of a given insulating layer with the conducting elements on the opposite side of the same insulating layer by passing directly through the insulating layer so as to form a complete circuit path from one circuit pattern level to another circuit pattern level. Such an interconnecting conducting element, also known as a via, allows for the crossing of one conductor over another conductor where the insulating level is interposed, thus providing for a greater number of possible independent circuit paths and also for increased circuit density.

There are several methods for fabricating the interconnecting conducting elements which pass through the insulating layer. These fabrication methods include lithographic processes similar to those used for semiconductor chip fabrication, and mechanical processes which include the steps of punching holes in the insulating layer and then adding material to form conductive structures passing through the holes. Methods for adding such material may include the filling of the holes with metallic pastes or the insertion of metal pins or similar structures. Of the several methods, mechanical processes are preferred because of cost.

One method of forming and transferring electrically conductive elements is shown in U.S. Pat. No. 2,854,074. This patent discloses a method of punching a conductive sheet and transferring the formed conductive element into a conductive substrate so as to displace a portion of the conductive substrate material. One disadvantage of the method as applied to the fabrication of multilayer substrates is the requirement for a die member which must be interposed between the conductive sheet and the conductive substrate.

A method of forming and transferring electrically conductive elements into an insulator is shown in U.S. Pat. No. 4,897,919. This patent discloses a method of forming an electrically conductive element by punching a conductive sheet and transferring the formed conductive element into an aperture in an insulator. A related method of forming and transferring electrically conductive elements into an insulator is shown in U.S. Pat. No. 5,035,049. This patent discloses a method of forming an electrically conductive element by punching a conductive sheet and transferring the formed conductive element onto, but not through, an insulator. A similar method is disclosed in German Patent DT 2,734,461 wherein a plurality of electrically conductive elements are formed by punching a conductive sheet and simultaneously transferring the formed conductive elements into previously formed perforations in an insulator. As in the previous art, one disadvantage of each method as applied to the fabrication of multilayer substrates is the requirement that a die member be interposed between the conductive sheet and the insulator.

The present invention is a method of forming and transferring electrically conductive, semi-conductive, resistive, or capacitive elements from a sheet of conducting material or a sheet of conductive, semi-conductive, resistive, or capacitive elements into a deformable dielectric material. If desired, a plurality of sheets of deformable dielectric material with the conductive elements therein may be stacked to form a multilayer substrate. The sheet of conducting material or the substrate may also be perforated or partially perforated. The sheet of conducting material may include sheets which comprise a clad or a porous material. The dielectric material may be perforated, partially perforated, or not perforated. The method comprises the steps of providing a multilayer structure comprising a sheet of a conducting material which is in direct contact with a sheet of a deformable dielectric material, followed by the use of a punch or similar element to form one or more slugs from the sheet of conducting material and then to immediately transfer the slug into the dielectric material. In one preferred embodiment of the invention, the method may include the additional step of displacing a portion of the deformable dielectric material so as to cause an interference fit between the slug and the dielectric material. In another preferred embodiment, the method may include, in addition or alternatively to other preferred embodiments, the step of aligning the punch or the multilayer structure with respect to the other. In yet another preferred embodiment, the method may also include the use of a porous conducting material to form the slug, which may be advantageous in the subsequent formation of metallurgical connections to the porous slug. Furthermore, the method may include the use of a clad conducting material to form the slug so as to cause a clad slug to be transferred. Articles produced by the method described herein may optionally have a means for electrically connecting to semiconductor chips attached thereto, or for electrically connecting to external devices.

Accordingly, one intended use of the present invention is as an improved method for the forming and transferring of one or more electrically conductive, semi-conductive, resistive, or capacitive elements into a deformable dielectric material which is useful in the fabrication of multilayer substrates for mounting semiconductor chips, where the improved method has the advantages of manufacturing process simplicity and reduced cost. In addition, the present invention may be useful in manufacturing or processing a variety of substrates, which may include, without limitation, sheets, moldings, castings, composite structures, integrated circuits, semiconductor chips, interconnect devices, multilayer chip carriers, circuit boards, component parts of thermal conduction modules, and other electronic substrates, and which may be perforated, partially perforated, or not perforated. Other advantages of the present invention are that the method may be useful for fabricating parts at a high rate, or that the method may be useful for fabricating parts having high circuit densities, or that the method may be useful for fabricating parts having precisely located conductors.

Additional uses and advantages of the present invention will become apparent to the skilled artisan upon reading the following detailed description of the invention and the preferred embodiments, considered in conjunction with the accompanying drawings.

BRIEF DESCRIPTION OF THE DRAWINGS

FIGS. 30A and 30B are a top view and a partial cross-sectional view of a substrate and transferred slug showing an alternate embodiment of the invention, wherein the transferred slug is a capacitor.

FIGS. 31A and 31B are a top view and a partial cross-sectional view of a substrate and transferred slug showing an alternate embodiment of the invention, wherein the transferred slug is a capacitor.

FIGS. 32A and 32B are a top view and a partial cross-sectional view of a substrate and transferred slug showing an alternate embodiment of the invention, wherein the transferred slug is a diode.

DETAILED DESCRIPTION OF THE INVENTION

Figure 1:
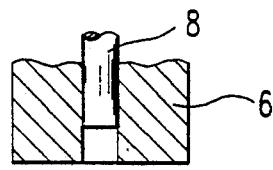
FIG. 1 is a partial cross-sectional view of a multilayer structure and an apparatus with an open die, according to the invention.
Figure 1:
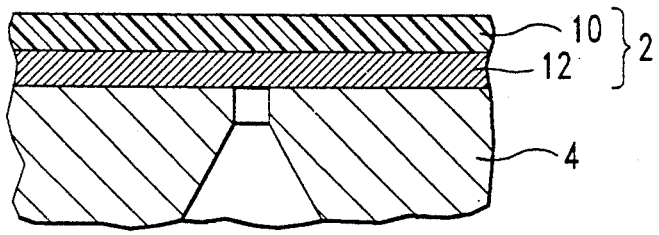

Referring to the Figures in more detail, and referring particularly to FIGS. 1-4, there is shown a partial cross-sectional view of elements of the apparatus used in the present invention for forming and direct transferring of electrically conductive elements into a substrate. Referring specifically to FIG. 1, there is shown a multilayer substrate (2) which is interposed between a die (4) and a shedder or pressure pad (6) containing a punch (8). The multilayer substrate comprises a sheet of conductive material (10) in direct contact with a deformable dielectric material (12).

The sheet of conductive material (10) may be any material which may be formed by punching according to the process of the invention and having a thickness of less than about 1 mm. Some of the more common materials are aluminum, copper, gold, or other ductile metals. Preferred materials include aluminum, copper, gold, or silver sheets, or alloys thereof, having a thickness of less than about 0.5 mm. The most preferred material is a copper sheet. While many embodiments described herein refer to conductive material, it is understood that semiconductive, resistive or capacitive material may also be used. Similarly, the sheet may comprise composite structures which are capacitive, inductive, resistive, or semiconductive microelectronic elements.

The deformable dielectric material (12) comprises a sheet, molding, casting, or composite structure capable of deformation by shearing or plastic flow when subjected to the process described herein. Examples of useful deformable dielectric materials are thermoplastics, and uncured ceramics. Preferred materials are liquid crystal polymers such as Xydar (Trademark) which is available from the Amoco Chemical Company, or Vecton (Trademark) which is available from the Hoechst Celanese Corporation.

The method for obtaining the multilayer substrate (2) from the separate sheet of conductive material (10) and the deformable dielectric material (12), prior to interposing the multilayer substrate between the die (4) and the punch (8), includes any method known or obvious in the art. In the present invention, the sheet of conductive material is placed manually. It should be understood that the present invention is not dependent on the method by which the multilayer substrate is provided, and many alternative methods for providing the substrate will be apparent to the skilled practitioner. For example, the conductive sheet may be rolled, stamped, or machined to the desired dimensions. The deformable dielectric element may be tape cast, extruded, molded, rolled, screened, or laminated. The sheet of conductive material and the deformable dielectric element may be placed together before or after they are placed into the apparatus. It is particularly noted, however, that the conductive sheet is in direct contact with the multilayer substrate comprising a deformable dielectric material at the time of the forming and transferring of the slug.

The die (4), pressure pad (6), and punch (8) are attached to a machine capable of performing punching, stamping, pressing, or similar operations, such as a punch press or like apparatus. In the present invention, a punch press was used, however, it will be apparent to the skilled artisan that many similar machines could be substituted therefor.

The method by which the multilayer substrate is brought into interposition between the die (4) and the punch (8) may include any method known or obvious in the art, including, without limitation, manual placement or automatic placement such as by conveyor, track, or shuttle. The multilayer substrate is located with respect to the punch and die by means of registering or banking an edge to a fence or work stop. Alternative methods are also expected to work well. Alternatively, the method may be practiced without alignment, by providing excess material and by trimming such excess after punching.

Figure 2:
FIG. 2 is a partial cross-sectional view of the apparatus with the pressure pad in contact with the multilayer structure.
Figure 2:
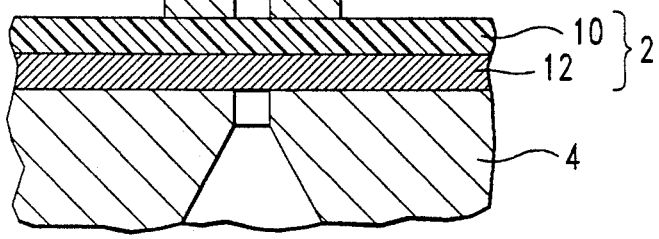
Figure 3:
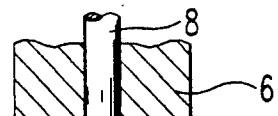
FIG. 3 is a partial cross-sectional view of the apparatus showing the formed and transferred slug.
Figure 3:
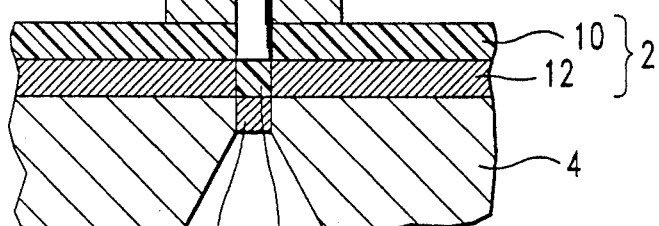
Figure 4:
FIG. 4 is a partial cross-sectional view of the apparatus showing the formed and transferred slug and showing the punch retracted.
Figure 4:
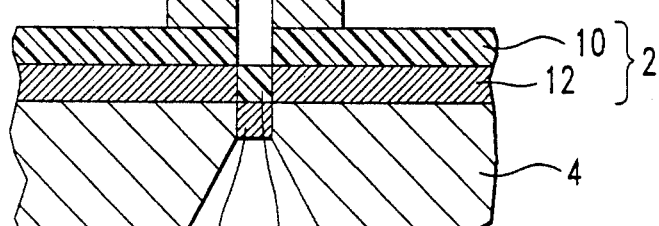

The sequence of forming and transferring a slug of conductive material is more clearly understood by reference to FIGS. 2–4. Referring particularly to FIG. 2, having interposed the multilayer substrate (2) between the die (4) and the punch (8), the pressure pad (6) is then brought into contact with the sheet of conductive material (10).

Next, referring particularly to FIG. 3, the punch (8) is forced into and through the sheet of conducting material (10) so as to form a slug (14) from the sheet of conductive material and to immediately transfer the slug into the deformable dielectric material (12). Thus, from the sheet of conductive material, a slug of conductive material is formed having a perimeter configuration and dimensions corresponding to the outline of the face of the punch, and having a thickness corresponding to the sheet of conducting material (10). The slug is transferred into the deformable dielectric material by the pressure of the punch on the slug, so as to deform the dielectric material and displace a portion thereof. The displaced portion of the deformable dielectric material (16) is forced into the die (4) under the pressure exerted by the slug and ultimately ejected.

Next, referring particularly to FIG. 4, the punch (8) is retracted from the multilayer structure (2), leaving the transferred slug (14) within the deformable dielectric material (12). The pressure pad (6) is then retracted from the surface of the used sheet of conductive material (10). The substrate is then removed from the apparatus, and the method may then be repeated.

Figure 5A:
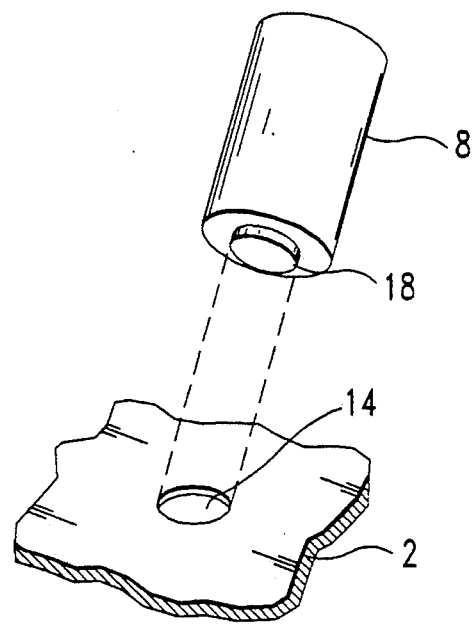
FIGS. 5A and 5B are a perspective views showing the punch face and the transferred slug.
Figure 5B:
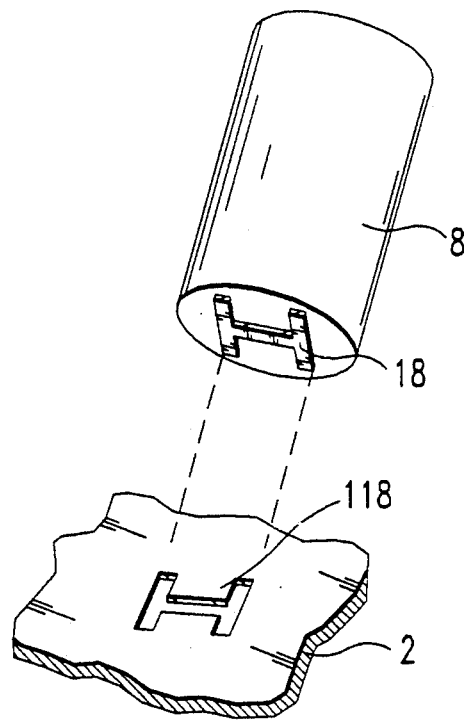

Referring to FIGS. 5A and 5B, the surface configuration of the face of the punch (8) is impressed on the surface of the slug (14) which is in contact with the punch by a coining or impact extrusion process. The surface configuration of the of the punch face may be flat or may comprise a relieved or an elevated form (18).

Referring again to FIG. 4, the method for separating the used punched or stamped sheet of conductive material (10) from the deformable dielectric material (12) having a formed and transferred slug therein (14) includes any method known or obvious in the art. In the present invention, the sheet of conductive material is removed by manual picking. As in the interpositioning steps prior to punching, it should be understood that the present invention is not dependent on the method by which said used sheet is removed, and many alternative methods for such removal will be apparent to the skilled practitioner.

Figure 6:
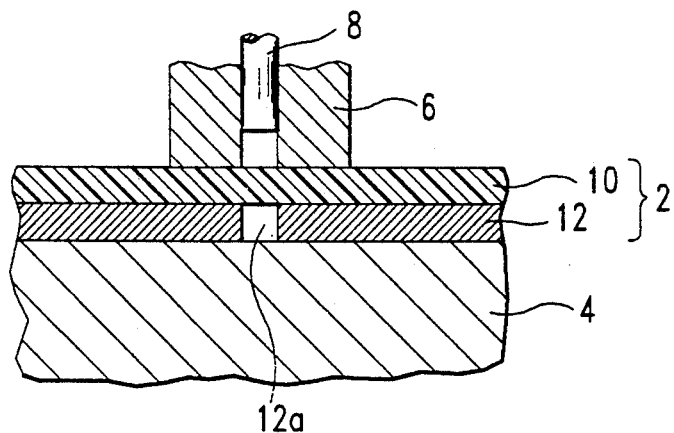
FIG. 6 is a partial cross-sectional view of a perforated multilayer structure with a solid die plate, according to the invention.
Figure 7:
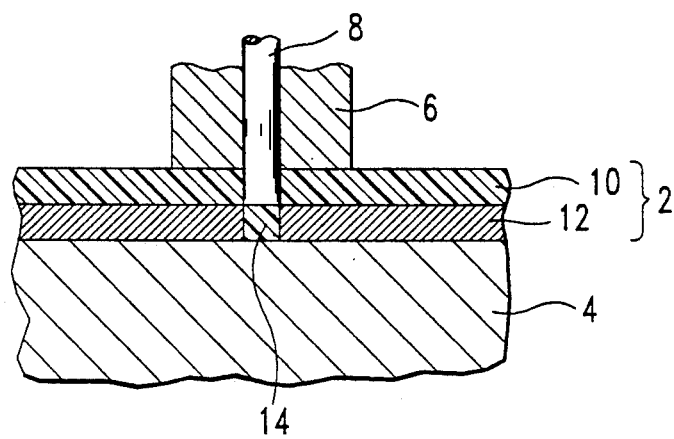
FIG. 7 is a partial cross-sectional view of the apparatus showing the formed and transferred slug.
Figure 8:
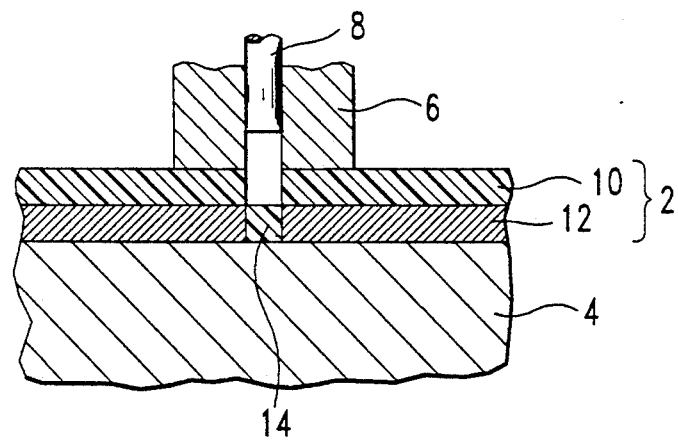
FIG. 8 is a partial cross-sectional view of the apparatus showing the formed and transferred slug and showing the punch retracted.

Referring to FIGS. 6–8, and referring particularly to FIG. 6, there is shown a partial cross-sectional view of elements of the apparatus used in an alternate embodiment of the present invention. A multilayer substrate (2) having at least one perforation is shown which is interposed between a solid die plate (4) and a shedder or pressure pad (6) containing a punch (8). The multilayer substrate comprises a sheet of conductive material (10) in direct contact with a deformable dielectric material (12) as described in detail previously.

The sequence of forming and transferring a slug of conductive material is similar to the previously described embodiment, however, certain differences are more clearly understood by particular reference to FIG. 7. The punch (8) is forced into and through the sheet of conductive material (10) so as to form a slug (14) from the sheet of conductive material and to immediately transfer the slug into the perforation in the deformable dielectric material (12). Thus, from the sheet of conductive material, a slug of conductive material is formed having a perimeter configuration and dimensions corresponding to the outline of the face of the punch, and having a thickness corresponding to the sheet of conducting material (10). The slug is transferred into the perforation in the deformable dielectric material by the pressure of the punch on the slug, then the punch is retracted from the multilayer structure (2) as hereinbefore described.

In a preferred embodiment which is more particularly shown in FIG. 8, the solid die plate (4) has an energy absorbing surface so as to minimize rebound of the transferred slug (14) and so as to cause the leading surface of the slug to remain essentially in contact with the solid die plate following transfer.

In another preferred embodiment, the transferred slug is larger than the at least one perforation in the multilayer substrate so as to cause displacement of at least a portion of the deformable dielectric material to be displaced upon transfer of the slug into the perforation in the multilayer substrate. This provides the advantage of a mechanically secure fit of the slug within the dielectric material.

Figure 9:
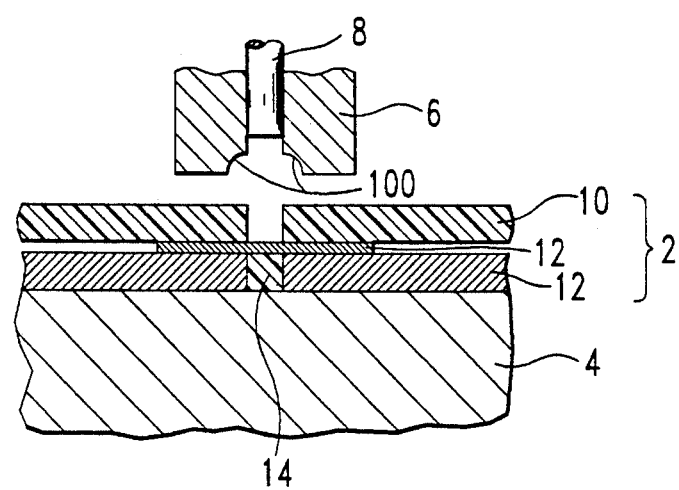
FIG. 9 is a partial cross-sectional view similar to FIG. 1, showing an alternate embodiment of the invention.

Referring to FIGS. 9–12, there is shown a partial cross-sectional view of a multilayer substrate used in an alternate embodiment of the present invention, where a slug is formed and transferred into a multilayer substrate having a metallized circuit pattern thereon. With particular reference to FIG. 9, there is shown a multilayer substrate (2) comprising a sheet of conductive material (10) in direct contact with a metallized circuit pattern (20) upon a deformable dielectric material (12). The sheet of conductive material is similar to that described above. The metallized circuit pattern comprises a layer or conductive element disposed on the substrate such as an electronic interconnect structure, a semiconductor metal wiring level, or other similar articles well known in the art. The pressure pad may optionally contain a cavity, groove, or relief (100) to provide clearance for other features.

Figure 10:
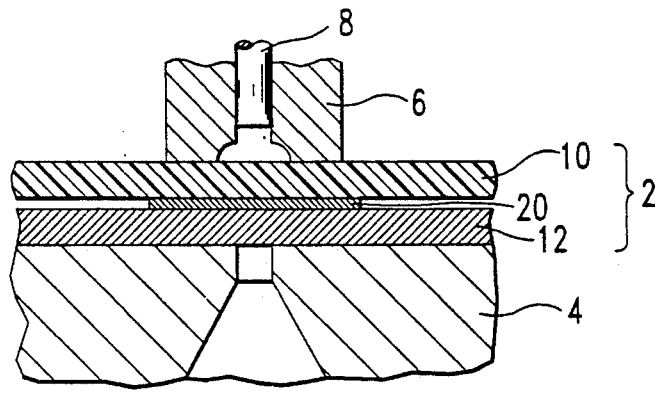
FIG. 10 is a partial cross-sectional view similar to FIG. 2, showing an alternate embodiment of the invention.
Figure 11:
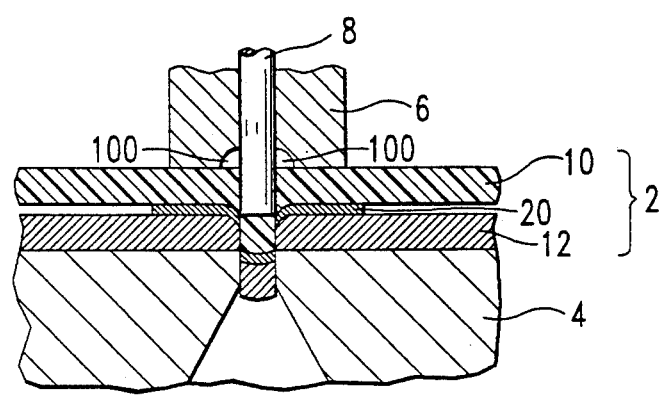
FIG. 11 is a partial cross-sectional view similar to FIG. 3, showing an alternate embodiment of the invention.
Figure 12:
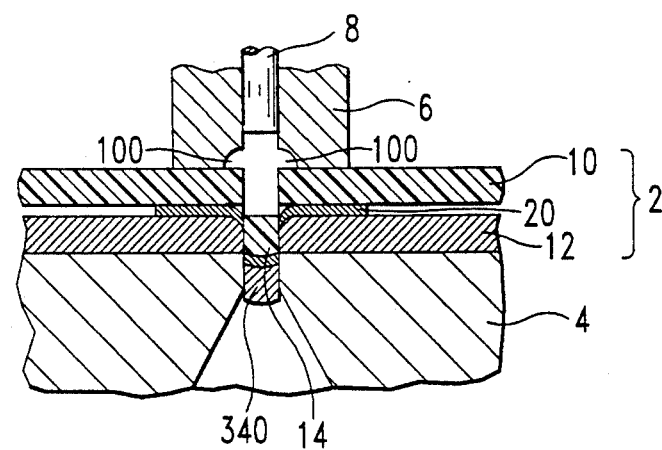
FIG. 12 is a partial cross-sectional view similar to FIG. 4, showing an alternate embodiment of the invention.

The sequence of forming and transferring a slug of conductive material is similar to the first described embodiment, however, certain differences are more clearly understood by reference to FIGS. 10–12. Referring particularly to FIG. 10, having interposed the multilayer substrate (2) between the die (4) and the punch (8), the pressure pad (6) is then brought into contact with the sheet of conductive material (10), so that the sheet of conductive material is in direct contact with the metallized circuit pattern (20), and the deformable dielectric material (12) is in contact with the die.

Next, referring particularly to FIG. 11, the punch (8) is forced into and through the sheet of conducting material (10) so as to form a slug (14) from the sheet of conductive material and to immediately transfer the slug into the deformable dielectric material (12). Thus, from the sheet of conductive material, a slug of conductive material is formed having a perimeter configuration and dimensions corresponding to the outline of the face of the punch, and having a thickness corresponding to the sheet of conducting material (10). The slug is transferred into and through a portion of the metallized circuit pattern (20) and into the deformable dielectric material by the pressure of the punch on the slug. The material comprising said portion of the metallized circuit pattern is thus deformed and a portion thereof is displaced, and electrical contact is made between the metallized circuit pattern and the slug. In turn, the displaced portion of the metallized circuit pattern is forced into and through the deformable dielectric material under the pressure of the transferred slug, so as to deform the dielectric material and displace a portion thereof. The displaced portions of the metallized circuit pattern and the deformable dielectric material (16) are forced into the die (4) under the pressure exerted by the slug and ultimately ejected.

Next, referring particularly to FIG. 12, the punch (8) is retracted from the multilayer structure (2), leaving the transferred slug (14) within the deformable dielectric material (12) and in electrical contact with the metallized circuit pattern (20). The displaced portion of the deformable dielectric material (340) is left in the die (4) and ultimately ejected. The pressure pad (6) is then retracted from the of the used sheet of conductive material (10). The substrate is then removed from the apparatus, and the method may then be repeated.

Figure 13:
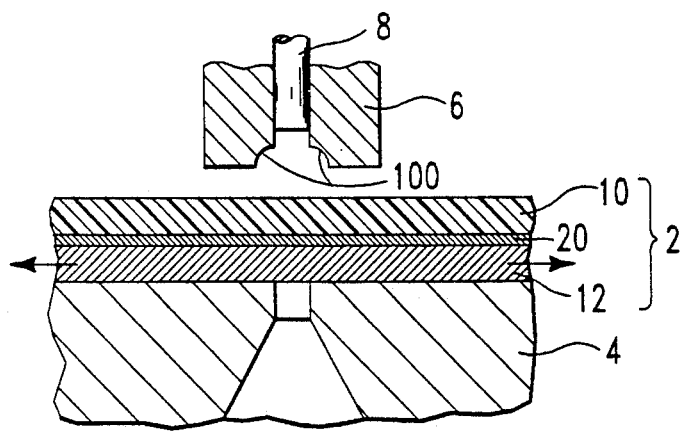
FIG. 13 is a partial cut-away view of the apparatus and a multilayer substrate showing an alternate embodiment.

In an alternate embodiment, the multilayer substrate is aligned or registered with respect to the die and punch prior to the steps of forming and transferring the slug. Referring to FIG. 13, the substrate is moved laterally in that plane which is essentially perpendicular to the punch so that the punch will strike the substrate with the required positional accuracy.

Figure 14:
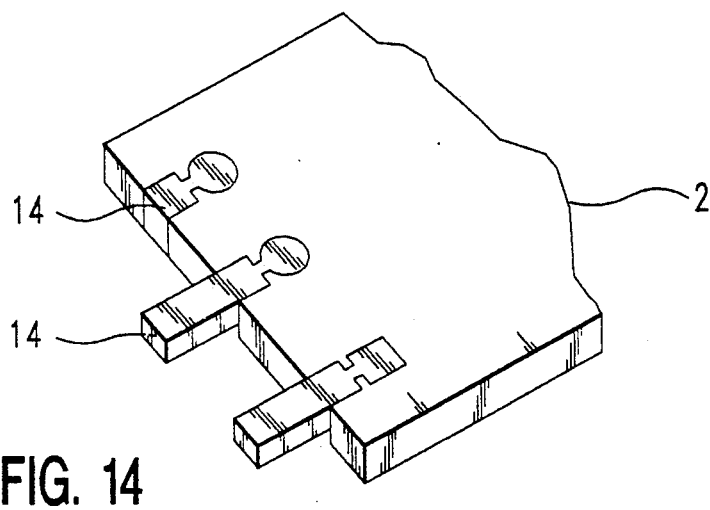
FIG. 14 is a partial top and edge perspective view of a multilayer substrate showing two alternate embodiments of the invention.
Figure 15:
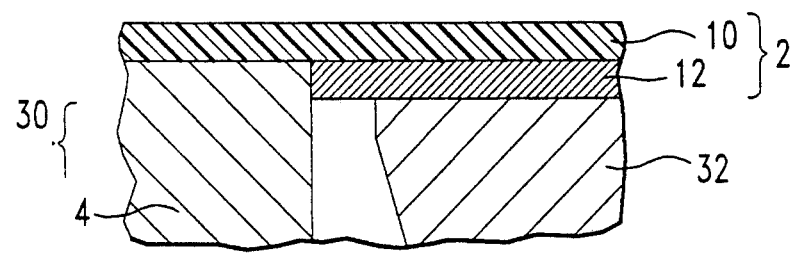
FIG. 15 is a partial cross-sectional view similar to FIG. 1, showing an alternate embodiment of the invention.
Figure 16:
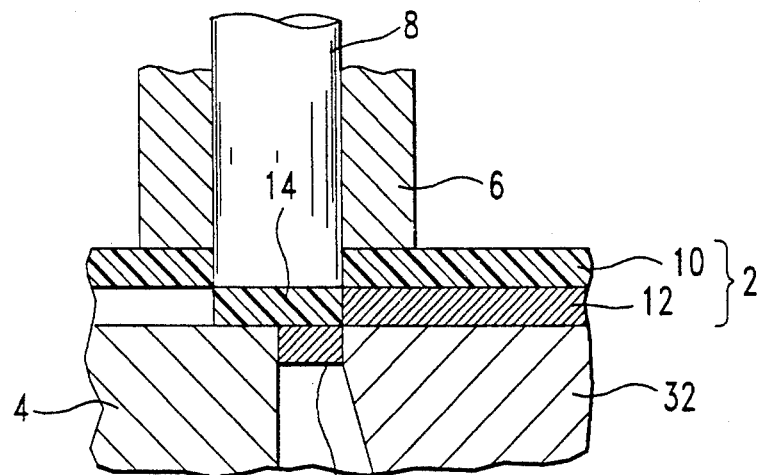
FIG. 16 is a partial cross-sectional view similar to FIG. 3, showing an alternate embodiment of the invention.

Referring to FIGS. 14–16, and referring particularly to FIG. 14, there are shown alternate embodiments of the present invention where one or more slugs (14) of conductive material are formed and transferred into a multilayer substrate (2) so as to form one or more conductive elements by which external electrical connections may be made.

Referring to FIGS. 15-16, and referring particularly to FIG. 15, there is shown a partial cross-sectional view of elements of the apparatus used in an alternate embodiment of the present invention. A die assembly (30) comprising a die (4), and a take up mechanism (32) is provided. A multilayer substrate (2) is provided which comprises a sheet of conductive material (10), as previously described, in direct contact with a deformable dielectric material (12) as previously described. The sheet of conductive material is positioned so as to extend beyond an edge of the deformable dielectric material. Said multilayer substrate is interposed between the die assembly and a shedder or pressure pad (6) containing a punch (8), and located so that the edge of the deformable dielectric material is in contact with the edge of the take up mechanism and so that the edge of the deformable dielectric material is coincident with the edge of the area to be punched, and so that the surface of the sheet of conductive material is in contact with the fixed take up mechanism.

The sequence of forming and transferring a slug of conductive material is similar to the previously described embodiment, however, certain differences are more clearly understood by particular reference to FIG. 16. The punch (8) is forced into and through the sheet of conducting material (10) so as to form a slug (14) from the sheet of conductive material and to immediately transfer the slug into the deformable dielectric material (12). Thus, from the sheet of conductive material, a slug of conductive material is formed having a perimeter configuration and dimensions corresponding to the outline of the face of the punch, and having a thickness corresponding to the sheet of conducting material (10). The slug is transferred into the deformable dielectric material by the pressure of the punch on the slug, so as to deform the dielectric material and displace a portion thereof. The displaced portion of the deformable dielectric material (16) is forced into the die (4) under the pressure exerted by the slug and ultimately ejected. The punch is then retracted from the multilayer structure (2), leaving the transferred slug within the deformable dielectric material as hereinbefore described.

Figure 17:
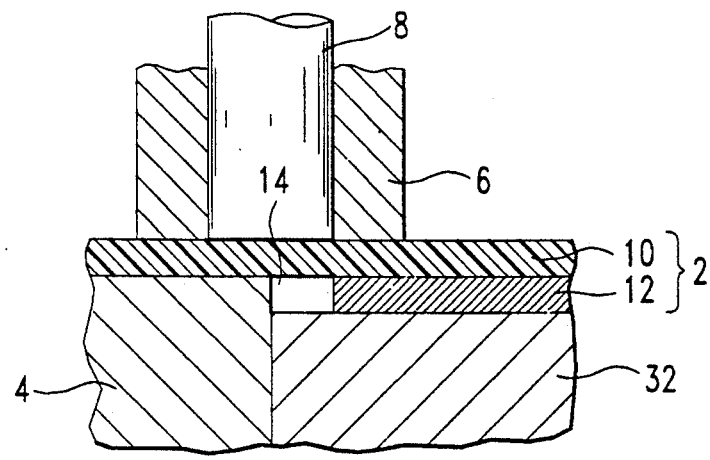
FIG. 17 is a partial cross-sectional view similar to FIG. 2, showing an alternate embodiment of the invention.
Figure 18:
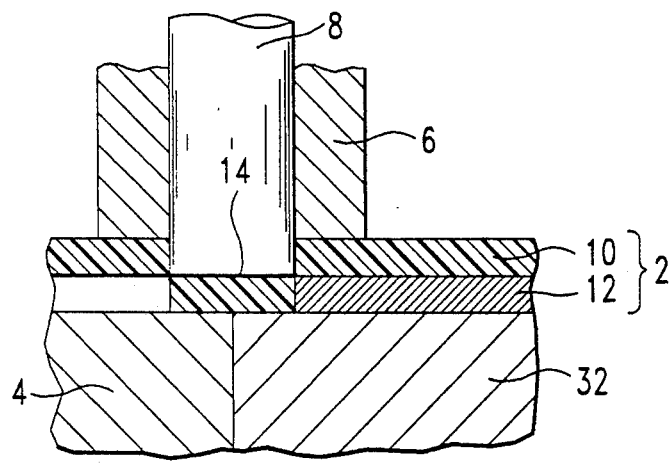
FIG. 18 is a partial cross-sectional view similar to FIG. 3, showing an alternate embodiment of the invention.
Figure 19:
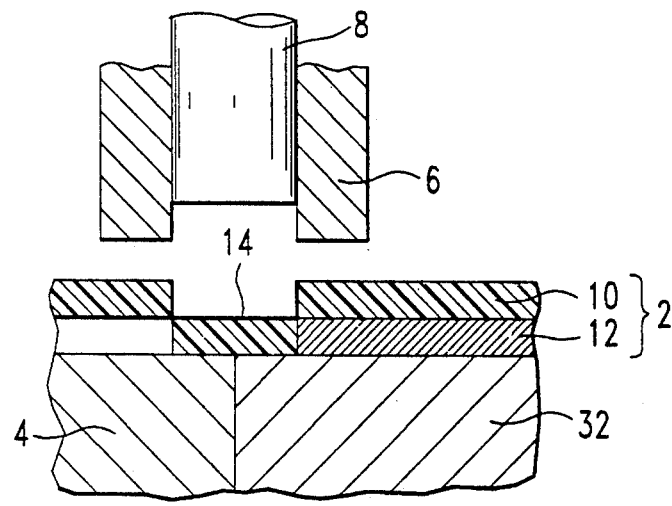
FIG. 19 is a partial cross-sectional view similar to FIG. 4, showing an alternate embodiment of the invention.
Figure 20A:
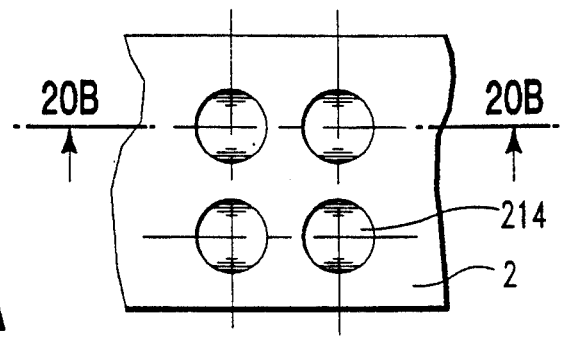
Figure 20B:
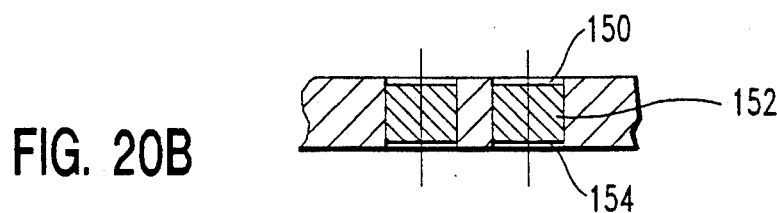
Figure 21A:
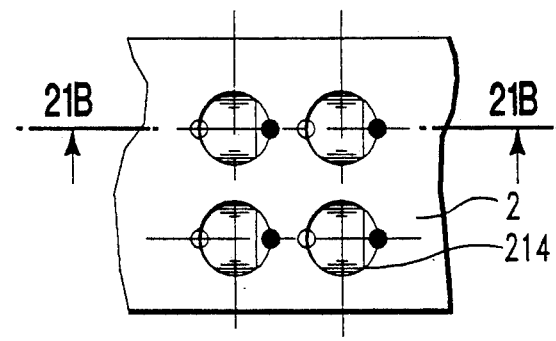
Figure 21B:
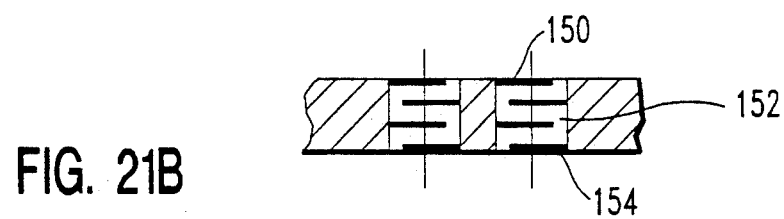
Figure 22A:
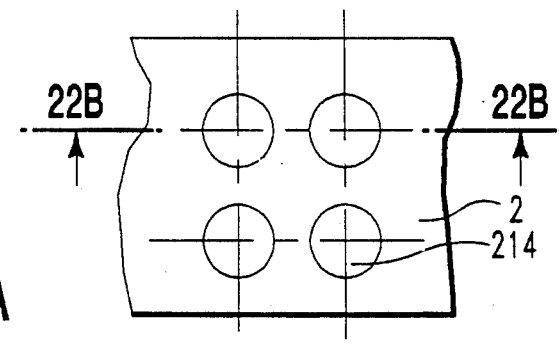
Figure 22B:
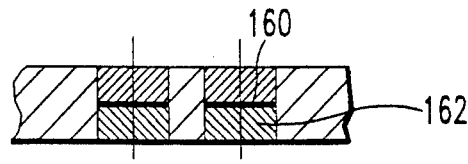

Referring to FIGS. 17–19, and referring particularly to FIG. 17, there is shown a partial cross-sectional view of elements of the apparatus used in another alternate embodiment of the present invention. In the present embodiment, a slug of conductive material (14) is formed and transferred into a multilayer substrate (2) so as to form a conductive element by which an external electrical connection may be made to a portion of the slug (14) which extends beyond the edge of the deformable dielectric material. A die assembly (30) comprising a die (4), and a moveable take up mechanism (36) is provided. The take up mechanism is free to move in the direction of travel of the transferred slug and may be biased or preloaded by a spring. A moveable take up mechanism having an energy absorbing surface (38) in contact with the sheet of conductive material is preferred.

A multilayer substrate (2) is provided which comprises a sheet of conductive material (10), as previously described, which is in direct contact with a deformable dielectric material (12), as previously described, and where the sheet of conductive material is positioned so as to extend beyond an edge of the deformable dielectric material (34). Said multilayer substrate is then interposed between the die assembly (30) and a shedder or pressure pad (6) containing a punch (8), and located so that the edge of the deformable dielectric material is laterally separated from the edge of the take up mechanism and so that the edge of the deformable dielectric material is positioned within at least a portion of the area to be punched, and so that the sheet of conductive material is in contact with the take up mechanism.

The sequence of forming and transferring a slug of conductive material is similar to the previously described embodiment, however, certain differences are more clearly understood by particular reference to FIG. 18. The punch (8) is forced into and through the sheet of conducting material (10) so as to form a slug (14) from the sheet of conductive material and to immediately transfer the slug into the deformable dielectric material (12). Thus, from the sheet of conductive material, a slug of conductive material is formed having a perimeter configuration and dimensions corresponding to the outline of the face of the punch, and having a thickness corresponding to the sheet of conducting material (10). The slug is transferred into the deformable dielectric material by the pressure of the punch on the slug, so as to deform the dielectric material and displace a portion thereof. The displaced portion of the deformable dielectric material (16) is forced into the die (4) under the pressure exerted by the slug and ultimately ejected. The movable take up mechanism is also displaced by the transferred slug.

Next, referring particularly to FIG. 19, the punch (8) is then retracted from the multilayer structure (2), leaving the transferred slug (14) within the deformable dielectric material (12) as hereinbefore described. Upon removal of the substrate from the apparatus, the movable take up mechanism (36) may return to the starting position shown in FIG. 17.

In an alternate embodiment of the invention (not shown), the sheet of conductive material (10) is porous so as to cause a porous slug (14) of conductive material to be formed and transferred. In the present embodiment, a multilayer substrate (2) comprising a sheet of conductive material which is porous is provided. In accord with the method disclosed herein for forming and transferring a slug, said porous slug is transferred into the deformable dielectric material (12). The advantages of a porous slug are inherent compressibility which is useful for achieving a secure fit in the substrate.

In yet another alternate embodiment of the invention (not shown), the sheet of conductive material (10) has a second material clad thereon so as to cause a clad slug to be formed and transferred. In the present embodiment, a multilayer substrate comprising a sheet of conductive material which is clad is provided. In accord with the method disclosed herein for forming and transferring a slug, said clad slug (14) is transferred into the deformable dielectric material (12).

In another alternate embodiment of the invention (not shown), a plurality of slugs are formed and transferred essentially simultaneously by means of multiple punches.

In yet another alternate embodiment of the invention, a sheet of material, clad on two sides, is substituted for the sheet of conductive material. Upon punching, a slug which is a capacitor is formed and transferred. Referring to FIGS. 30A and 30B, and referring particularly to FIG. 30A, there is shown a top view of a capacitor slug (214) which has been formed and transferred into a substrate (2). In FIG. 30B is shown a partial cross-sectional view of the capacitor slug taken through section A—A. In particular, FIG. 30B shows a capacitor slug comprising a first conductor (150), separated by a dielectric material (152), from a second conductor (154). The first and second conductors form the capacitor plates and may be further electrically connected to other elements.

In yet another alternate embodiment of the invention, a sheet of material, comprising preformed capacitor elements, is substituted for the sheet of conductive material. Upon punching, a slug which is a capacitor is formed and transferred. Referring to FIGS. 31A and 31B, and referring particularly to FIG. 31A, there is shown a top view of a capacitor slug (214) which has been formed and transferred into a substrate (2). In FIG. 31B is shown a partial cross-sectional view of the capacitor slug taken through section A—A. In particular, FIG. 31B shows a capacitor slug comprising a first conductor (150), separated by a dielectric material (152), from a second conductor (154). The first and second conductors form the capacitor plates and may be further electrically connected to other elements.

In yet another alternate embodiment of the invention, a clad sheet of material, comprising at least two materials which together in contact form a semiconductor junction, is substituted for the sheet of conductive material. Upon punching, a slug which is a diode is formed and transferred. Referring to FIGS. 32A and 32B, and referring particularly to FIG. 32A, there is shown a top view of a diode slug (214) which has been formed and transferred into a substrate (2).

In FIG. 32B is shown a partial cross-sectional view of the diode slug taken through section A—A. In particular, FIG. 32B shows a diode slug formed by the present invention comprising a first junction material (160), in contact with a second junction material (152). The first and second junction materials form a diode and may be further electrically connected to other elements.

In yet additional embodiments (not shown), the slug may be formed from a resistive material or may comprise a preformed resistor or inductor.

Upon a reading of the present disclosure, it will be apparent to the skilled artisan that other embodiments of the present invention beyond those embodiments specifically described herein may be made or practiced without departing from the spirit of the invention. Similarly, combinations and modifications of the presently disclosed embodiments will also become apparent. The embodiments disclosed are intended to teach the practice of the invention and are intended to be illustrative and not limiting. Accordingly, such apparent but undisclosed embodiments, combinations, and modifications are considered to be within the scope of the present invention as limited solely by the appended claims.

What is claimed is:

1. A method of forming and transferring electrically semiconductive or resistive elements into a deformable dielectric material, comprising the steps of:
    providing a multilayer structure comprising a sheet, molding, casting, or composite structure of a deformable dielectric material and a sheet of a semiconducting, or resistive material, said semiconducting, or resistive material being in direct contact with said dielectric material; and
    punching or stamping said multilayer structure so as to form and transfer a slug of material from the sheet of semiconducting, or resistive material into the dielectric material.

2. The method of claim 1 wherein said dielectric material has a metallized circuit pattern thereon and the transferred slug makes contact with the metallized circuit pattern.

3. The method of claim 1 wherein a plurality of slugs are transferred.

4. The method of claim 1 wherein the sheet of conducting, semiconducting, or resistive material is porous so as to cause a porous slug to be transferred.

5. The method of claim 1 wherein the sheet of conducting, semiconducting, or resistive material consists of a material upon which is clad a second material so as to cause a clad slug to be transferred.

6. The method of claim 1 wherein said transferred slug is disposed in said dielectric material so as to extend to at least one edge of said dielectric material.

7. The method of claim 1 wherein said transferred slug has a relieved or elevated image impressed on at least one surface thereof.

8. The method of claim 1 further comprising the step of aligning, to each other, said multilayer structure and the means for punching or stamping.

9. The method of claim 1 wherein said dielectric material is selected from the group consisting of thermoplastics, liquid crystal polymers, and uncured ceramic materials.

10. The method of claim 3 wherein the sheet of conducting, semiconducting, or resistive material is porous so as to cause a porous slug to be transferred.

11. The method of claim 3 wherein the sheet of conducting, semiconducting, or resistive material consists of a material upon which is clad a second material so as to cause a clad slug to be transferred.

12. The method of claim 3 wherein said transferred slug is disposed in said dielectric material so as to extend to at least one edge of said dielectric material.

13. The method of claim 3 wherein said transferred slug has a relieved or elevated image impressed on at least one surface thereof.

14. The method of claim 1 wherein said sheet, molding, casting, or composite structure of a deformable dielectric material has at least one perforation.

15. The method of claim 14 wherein said dielectric material has a metallized circuit pattern thereon and the transferred slug makes contact with the metallized circuit pattern.

16. The method of claim 14 wherein a plurality of slugs are transferred.

17. The method of claim 14 wherein the sheet of conducting, semiconducting, or resistive material is porous so as to cause a porous slug to be transferred.

18. The method of claim 14 wherein the sheet of conducting, semiconducting, or resistive material consists of a material upon which is clad a second material so as to cause a clad slug to be transferred.

19. The method of claim 14 wherein said transferred slug is disposed in said dielectric material so as to extend to at least one edge of said dielectric material.

20. The method of claim 14 wherein said transferred slug has a relieved or elevated image impressed on at least one surface thereof.

21. The method of claim 14 further comprising the step of aligning to each other said multilayer substrate and the means for punching or stamping.

22. The method of claim 14 wherein said dielectric material is selected from the group consisting of thermoplastics, liquid crystal polymers, and uncured ceramic materials.

23. The method of claim 14 wherein said transferred slug is larger than said perforation so as to cause displacement of a portion of said dielectric material upon transfer of the slug into said at least one perforation of the dielectric material.

24. The method of claim 23 wherein said dielectric material has a metallized circuit pattern thereon and the transferred slug makes contact with the metallized circuit pattern.

25. The method of claim 23 wherein a plurality of slugs are transferred.

26. The method of claim 14 further comprising the step of providing an energy absorbing element proximate to a surface of said multilayer substrate, so as to minimize rebound of the transferred slug.

27. The method of claim 1 wherein the transferred slug is a capacitor.

28. The method of claim 1 wherein the transferred slug is a resistor.

29. The method of claim 1 wherein the transferred slug is an inductor.

30. The method of claim 1 wherein the transferred slug is a semiconductor device.

31. The method of claim 30 wherein the transferred slug is a diode.

32. A method of forming and transferring electrically conductive, semiconductive, resistive, or capacitive elements into a deformable dielectric material, comprising the steps of:

providing a multilayer structure comprising a sheet, molding, casting, or composite structure of a deformable dielectric material and a sheet of a conducting, semiconducting, or resistive material, said conducting, semiconducting, or resistive material being in direct contact with said dielectric material; and punching or stamping said multilayer structure so as to form and transfer a slug of material from the sheet of conducting material into the dielectric material, wherein the transferred slug is selected from the group consisting of capacitors, resistors, inductors, and semiconductor devices.

33. The method of claim 32 wherein said dielectric material has a metallized circuit pattern thereon and the transferred slug makes contact with the metallized circuit pattern.

34. The method of claim 32 wherein a plurality of slugs are transferred.

35. A method of forming and transferring electrically conductive, semiconductive, resistive, or capacitive elements into a deformable dielectric material, comprising the steps of:

providing a multilayer structure comprising a sheet, molding, casting, or composite structure of a deformable dielectric material and a sheet comprising circuit elements selected from the group consisting of capacitors, resistors, inductors, and semiconductor devices, said sheet comprising circuit elements being in direct contact with said dielectric material; and punching or stamping said multilayer structure so as to form and transfer a slug of material from the sheet comprising circuit elements into the dielectric material.

36. The method of claim 35 wherein said dielectric material has a metallized circuit pattern thereon and the transferred slug makes contact with the metallized circuit pattern.

37. The method of claim 35 wherein a plurality of slugs are transferred.

38. A method of forming and transferring electrically conductive, semiconductive, resistive, or capacitive elements into a deformable dielectric material, comprising the steps of:

providing a multilayer structure comprising a sheet, molding, casting, or composite structure of a deformable dielectric material and a clad sheet comprising a conducting material first layer and a second layer selected from the group consisting of semiconducting materials, resistive materials, and dielectric materials, said clad sheet being in direct contact with said dielectric material; and punching or stamping said multilayer structure so as to form and transfer a slug of material from the clad sheet into the dielectric material so as to cause a clad slug to be transferred.

39. The method of claim 38 wherein said dielectric material has a metallized circuit pattern thereon and the transferred slug makes contact with the metallized circuit pattern.

40. The method of claim 38 wherein a plurality of slugs are transferred.

41. The method of claim 38 wherein said dielectric material is selected from the group consisting of thermoplastics, liquid crystal polymers, and uncured ceramic materials.

42. The method of claim 38 wherein said sheet, molding, casting, or composite structure of a deformable dielectric material has at least one perforation.

43. The method of claim 38 wherein the transferred slug is a capacitor.

44. The method of claim 38 wherein the transferred slug is a resistor.

45. The method of claim 38 wherein the transferred slug is an inductor.

46. The method of claim 38 wherein the transferred slug is a semiconductor device.

47. The method of claim 46 wherein the transferred slug is a diode.

* * * * *